US012812972B2

(12) United States Patent
Yan

(10) Patent No.: US 12,812,972 B2
(45) Date of Patent: Nov. 24, 2026

(54) DISPLAY PANELS

(71) Applicant: WUHAN CHINA STAR OPTOELECTRONICS TECHNOLOGY CO., LTD., Wuhan (CN)

(72) Inventor: Yuan Yan, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 420 days.

(21) Appl. No.: 18/522,222

(22) Filed: Nov. 29, 2023

(65) Prior Publication Data

US 2024/0096899 A1 Mar. 21, 2024

Related U.S. Application Data

(63) Continuation of application No. 16/311,693, filed as application No. PCT/CN2018/113268 on Nov. 1, 2018, now Pat. No. 11,869,895.

(30) Foreign Application Priority Data

Sep. 28, 2018 (CN) ......................... 201811135751.9

(51) Int. Cl.
*H10F 30/20* (2025.01)
*G06F 3/041* (2006.01)
(Continued)

(52) U.S. Cl.
CPC ........... *H10D 86/40* (2025.01); *G06F 3/0412* (2013.01); *G06F 3/0421* (2013.01); *G06V 40/13* (2022.01);
(Continued)

(58) Field of Classification Search
CPC . G06F 2203/04103; G06F 2203/04107; G06F 3/0412; G06F 3/0421; G06V 40/13;
(Continued)

(56) References Cited

U.S. PATENT DOCUMENTS 5,710,606 A 1/1998 Nakajima
6,639,244 B1 * 10/2003 Yamazaki ............ H10D 86/481 257/70
(Continued)

FOREIGN PATENT DOCUMENTS

CN 1678952 A 10/2005
CN 1894798 A 1/2007
(Continued)

OTHER PUBLICATIONS

Chinese Office Action issued in corresponding Chinese Patent Application No. 201811135751.9 dated Aug. 30, 2023, pp. 1-9.
(Continued)

*Primary Examiner* — Meiya Li
(74) *Attorney, Agent, or Firm* — PV IP PC; Christpoher S. Ruprecht; Wei Te Chung

(57) ABSTRACT

Display panels are provided. The display panel includes a substrate and a thin film transistor (TFT) disposed on the substrate. The TFT includes a polysilicon layer, a gate layer, and a source-drain contacting layer. The polysilicon layer includes a first portion corresponding to the gate layer, two second portions disposed on two opposite sides of the first portion, two third portions disposed on two outer sides of the two second portions away from the first portion, and a fourth portion. The fourth portion is disposed on one of the two third portions to define a PN structure therebetween. The source-drain contacting layer is disposed on the gate layer and electrically contacts the fourth portion and the two third portions.

20 Claims, 5 Drawing Sheets

(51) Int. Cl.

| | |
|---|---|
| ***G06F 3/042*** | (2006.01) |
| ***G06V 40/13*** | (2022.01) |
| ***H10D 86/40*** | (2025.01) |
| ***H10D 86/60*** | (2025.01) |
| ***H10F 77/122*** | (2025.01) |

(52) U.S. Cl.
CPC ....... *G06V 40/1318* (2022.01); *H10D 86/471* (2025.01); *H10D 86/60* (2025.01); *H10F 30/20* (2025.01); *H10F 77/1228* (2025.01); *G06F 2203/04103* (2013.01); *G06F 2203/04107* (2013.01)

(58) Field of Classification Search
CPC .. G06V 40/1318; H10D 86/40; H10D 86/471; H10D 86/60; H10F 30/20; H10F 77/1228
See application file for complete search history.

(56) References Cited

U.S. PATENT DOCUMENTS

| | | | | |
|---|---|---|---|---|
| 8,076,195 B2 * | 12/2011 | Liu | H10B 63/20 438/237 |
| 2001/0019384 A1 * | 9/2001 | Murade | G02F 1/136209 349/110 |
| 2007/0093007 A1 | 4/2007 | Deane | |
| 2008/0135851 A1 | 6/2008 | Kim | |
| 2011/0284851 A1 | 11/2011 | Liu | |
| 2012/0242624 A1 | 9/2012 | Tomiyasu | |

FOREIGN PATENT DOCUMENTS

| | | |
|---|---|---|
| CN | 101226948 A | 7/2008 |
| CN | 102253548 A | 11/2011 |
| CN | 102576739 A | 7/2012 |
| CN | 107623011 A | 1/2018 |
| CN | 208738250 U | 4/2019 |

OTHER PUBLICATIONS

International Search Report in International application No. PCT/CN2018/113268, mailed on Feb. 22, 2019.
Written Opinion of the International Search Authority in International application No. PCT/CN2018/113268, mailed on Feb. 22, 2019.

* cited by examiner

DISPLAY PANELS

CROSS-REFERENCE TO RELATED APPLICATIONS

This application is a continuation application of U.S. patent application Ser. No. 16/311,693, filed on Dec. 20, 2018, which is a US national phase application based upon an International Application No. PCT/CN2018/113268, filed on Nov. 1, 2018, which claims priority to Chinese Patent Application No. 201811135751.9, filed on Sep. 28, 2018. The disclosures of the aforementioned applications are incorporated herein by reference in their entireties.

FIELD OF INVENTION

The present disclosure relates to a display panel and a manufacturing method thereof, and in particular to a display panel for touchscreen and a manufacturing method thereof.

BACKGROUND OF INVENTION

In the prior art, a medical amorphous silicon panel detector is a conventional optical sensor, which comprises amorphous silicon photodiodes and thin film transistors. As shown in FIG. 1, a schematic diagram of a panel detector pixel unit is illustrated, wherein pixel units are formed on a substrate 11. Each of the pixel units comprises a thin film transistor 12 and an amorphous silicon photodiode 13, wherein the amorphous silicon photodiode 13 includes a first light shielding layer 131, a first insulating layer 132, a drain electrode layer 133, an N-type layer 134, an intermediate layer 135, a P-type layer 136 and a contact electrode 137.

Furthermore, an insulating layer 14 insulates the thin film transistor 12 from the amorphous silicon photodiode 13. A second light shielding layer 15 is formed on the thin film transistor 12 and a portion of the surface of the insulating layer 14 where no light is required. A connection electrode 16 is formed on the contact electrode 137. A passivation layer 17 is formed on the second light shielding layer 15 and the connection electrode 16. The first light shielding layer 131 and a gate of the thin film transistor 12 are located on the same metal layer, and the drain electrode layer 133 and a drain of the thin film transistor 12 are located on the same metal layer.

However, the main part of the amorphous silicon photodiode is a stack of the P-type layer 136, the intermediate layer 135, and the N-type layer 134, wherein the intermediate layer 135 is processed by lightly doping. Therefore, the thickness of the panel detector is approximately the thickness of the amorphous silicon photodiode 13 superimposed on the drain of the thin film transistor 12, and the intermediate layer 135 of the amorphous silicon photodiode has a thickness of about 1 micrometer so that the thickness of the panel detector is larger. The optical path of the incident light in the pixel unit of the panel detector is long, and the incident light easily enters adjacent pixel units to cause interference.

In addition, the pixel unit includes the thin film transistor 12 and the amorphous silicon photodiode 13 disposed separately, wherein the thin film transistor 12 and the amorphous silicon photodiode 13 are separated by a distance so that the pixel unit has a larger occupied area and a lower resolution. Moreover, the amorphous silicon photodiode 13 needs to be separately fabricated after forming the thin film transistor 12, and multiple steps of film formation and lithography are required during the fabrication process so that production cost higher.

As a result, it is necessary to provide a display panel and a manufacturing method thereof to solve the problems existing in the conventional technologies, as described above.

SUMMARY OF INVENTION

The present disclosure provides display panels. The display panel includes a substrate and a thin film transistor (TFT) disposed on the substrate; the TFT includes a polysilicon layer, a gate layer, and a source-drain contacting layer; the polysilicon layer includes a first portion corresponding to the gate layer, two second portions disposed on two opposite sides of the first portion, two third portions disposed on two outer sides of the two second portions away from the first portion, and a fourth portion; the fourth portion is disposed on one of the two third portions to define a PN structure therebetween; and the source-drain contacting layer is disposed on the gate layer and electrically contacts the fourth portion and the two third portions.

DESCRIPTION OF DRAWINGS

In order to more clearly illustrate the embodiments or the prior art technical solutions embodiment of the present disclosure, will implement the following figures for the cases described in the prior art or require the use of a simple introduction. Obviously, the following description of the drawings are only some of those of ordinary skill in terms of creative effort without precondition, you can also obtain other drawings based on these drawings embodiments of the present disclosure.

DETAILED DESCRIPTION OF PREFERRED EMBODIMENTS

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
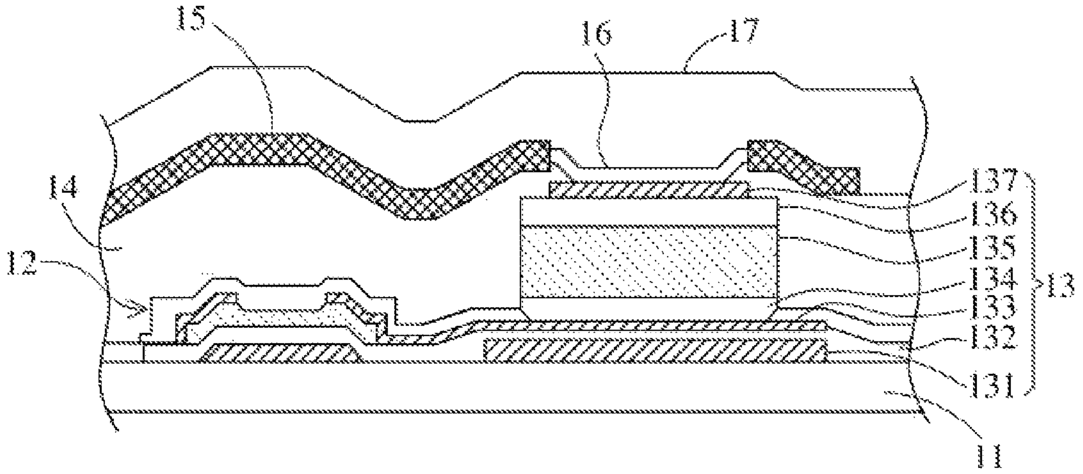
FIG. 1 (Prior Art)
FIG. 1 is a schematic diagram of a pixel unit of a panel detector in the prior art.
Figure 2:
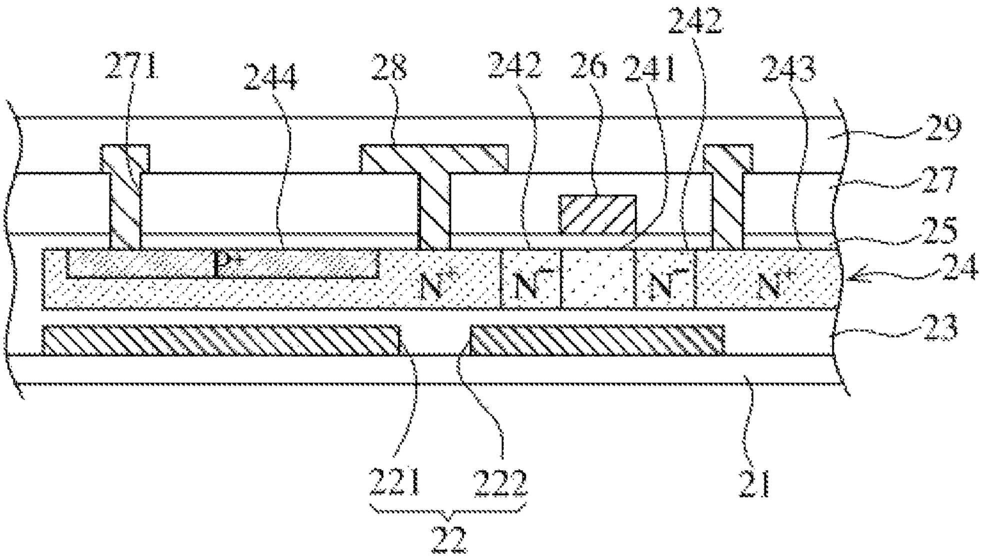
FIG. 2 is a schematic diagram of a display panel according to a preferred embodiment of the present disclosure.

Referring to FIG. 2, a schematic diagram of a display panel according to a preferred embodiment of the present disclosure is illustrated. The display panel comprises a glass substrate 21, a light shielding layer 22, an insulating layer 23, a polysilicon layer 24, a gate insulating layer 25, a gate layer 26, an interlayer insulating layer 27, a source-drain contacting layer 28, and a passivation layer 29. The detailed structure of each component, assembly relationships, and principles of operation for the present invention will be described in detail hereinafter. It should be noted that the TFT of the top gate structure is used for description in the embodiment, and the same manner can also be applied to the display panel of the TFT structure of the bottom gate structure. Similarly, TFTs of different semiconductor types are equally applicable to the solution in this application. For example, those skilled in the art can adjust the doping type of the N-type TFT and the P-type TFT.

Referring to FIG. 2, the light shielding layer 22 is formed on the glass substrate 21, and the light shielding layer 22 comprises a first light shielding portion 221 and a second light shielding portion 222, wherein the first light shielding portion 221 and the second light shielding portion 222 are spaced to with other and disposed on the glass substrate 21.

Referring to FIG. 2, the insulating layer 23 is formed on the light shielding layer 22 and the glass substrate 21, and the polysilicon layer 24 is formed on the insulating layer 23, wherein the polysilicon layer 24 is defined with a non-doped region 241, a first doped region 243, a second doped region 242, and a third doped region 244. a doping type of the first doped region 243 and a doping type of the third doped region 244 are different so that the first doped region 243 and the third doped region 244 form a PN structure, and the doping type of the first doped region 243 and a doping type of the second doped region 242 are same. In the embodiment, the second doped region 242 is formed with two N-type lightly doped regions processed N-type light doping by ion implantation, the first doped region 243 is formed with two N-type heavily doped regions processed N-type heavy doping by ion implantation, and the third doped region 244 is formed with a P-type doped region processed P-type doping by ion implantation. In the other embodiment, the doped regions can be doped with different types, such as the second doped region 242 is processed P-type light doping, the first doped region 243 is processed P-type heavy doping, and the third doped region 244 is processed N-type doping.

Furthermore, the N-type lightly doped regions of the second doped region 242 are located at two opposite sides of the non-doped region 241, respectively. The N-type heavily doped regions of the first doped region 243 are adjacent to the side of the N-type lightly doped regions of the second doped region 242 away from the non-doped region 241, and the third doped region 244 is overlapped on one of the N-type heavily doped regions of the first doped region 243. In in the embodiment, a projection of the non-doped region 241 projected on the glass substrate 21 overlaps a projection of the gate layer 26 projected on the glass substrate 21, a projection of the second light shielding portion 222 of the light shielding layer 22 projected on the glass substrate 21 overlaps a projection of the N-type lightly doped regions of the second doped region 242 projected on the glass substrate 21, and a projection of the P-type doped region of the third doped region 244 projected on the glass substrate 21 overlaps a projection of the first light shielding portion 221 of the light shielding layer 22 projected on the glass substrate 21 and a projection of the N-type heavily doped region of the first doped region 243 projected on the glass substrate 21.

Referring to FIG. 2, the gate insulating layer 25 is formed on the polysilicon layer 24, and the gate layer 26 is formed on the gate insulating layer 25, wherein the gate layer 26 is a first metal layer by patterning.

Referring to FIG. 2, the interlayer insulating layer 27 is formed on the gate layer 26 and the gate insulating layer 25, wherein the interlayer insulating layer 27 is formed with a plurality of holes 271. The holes 271 are configured to form the source-drain contacting layer 28 so that the source-drain contacting layer 28 is formed on the interlayer insulating layer 27. The passivation layer 29 is formed on the source-drain contacting layer 28 and the interlayer insulating layer 27.

Referring to FIG. 2, the first doped region 243 is formed with two N-type heavily doped regions configured to be a $N^+$-type layer, the third doped region 244 is formed with a P-type doped region configured to be a P-type layer, so that the first doped region 243 and the third doped region 244 form a PN structure, and the source-drain contacting layer 28 contacts the $N^+$-type layer of the first doped region 243 and the P-type layer of the third doped region 244.

According to the above structure, the PN structure formed from the first doped region 243 and the third doped region 244 is located above the first light shielding portion 221, and can be defined as an amorphous silicon photodiode to sense the reflected light of the finger, wherein the anode of the amorphous silicon photodiode is the P-type layer provided with a negative voltage between −3V to −9V. The amorphous silicon photodiode generates electron-hole pairs when an optical signal is incident on the amorphous silicon photodiode. In the electric field, the holes converge to the P-type layer (anode), and electrons converge to the N-type layer (cathode). In addition, the second doped region 242, the first doped region 243, and the gate layer 26 are located above the second light shielding portion 222, and can be defined as a thin film transistor, such as a TFT thin film transistor. When the thin film transistor is turned off, the signals are continuously accumulated. When the thin film transistor is turned on, the charge outputs to the data line, and the strength of the optical signal is determined according to the detected charge signal to achieve the effect of fingerprint recognition.

As described above, the thin film transistor is formed on the glass substrate 21 by polysilicon, and the amorphous silicon photodiode is formed by ion implantation technology, so that the intensity of the reflected light of the fingerprint can be recognized by the amorphous silicon photodiode. Since the thin film transistor has a low leakage current, and the current of the amorphous silicon photodiode is identified to obtain a better signal to noise ratio. In addition, the PN structure can realize N-type and P-type doping by ion implantation depth and ion complementary effect. Thus, the thin film transistor and the amorphous silicon photodiode are simultaneously prepared in the process without additional complicated structures and processes.

Referring to FIGS. 2 to 9, FIG. 3 is a flowchart of a manufacturing method of the display panel according to a preferred embodiment of the present disclosure. The manufacturing method comprises a light shielding layer forming step S201, a polysilicon layer forming step S202, a first doped region doping step S203, a second doped region doping step S204, a third doped region doping step S205, an interlayer insulating layer forming step S206, a source-drain contacting layer forming step S207, and a passivation layer forming step S208. The detailed principles of operation for the present invention will be described in detail hereinafter.

Figure 3:
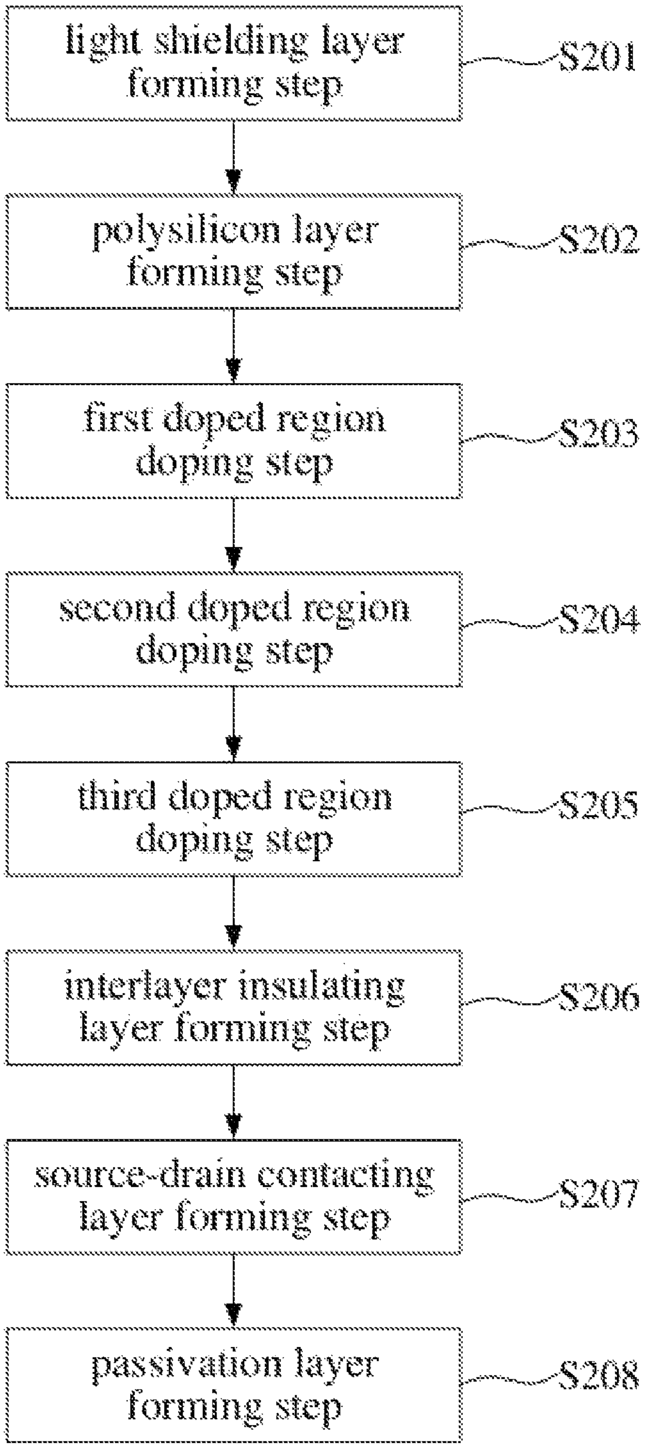
FIG. 3 is a flowchart of a manufacturing method of the display panel according to a preferred embodiment of the present disclosure.
Figure 4:
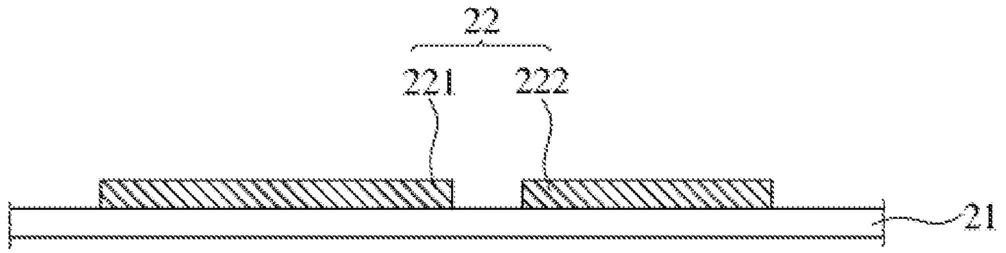
FIG. 4 is a schematic diagram in a light shielding layer forming step of the manufacturing method of the display panel according to a preferred embodiment of the present disclosure.

Referring to FIGS. 3 and 4, in the light shielding layer forming step S201, a glass substrate 21 is provided, and an opaque material layer is deposited on the glass substrate 21, such as metal layer, and then opaque material layer is patterned as a light shielding layer 22. The light shielding layer 22 comprises a first light shielding portion 221 and a second light shielding portion 222, wherein the first light shielding portion 221 and the second light shielding portion 222 are spaced to with other and disposed on the glass substrate 21.

Figure 5:
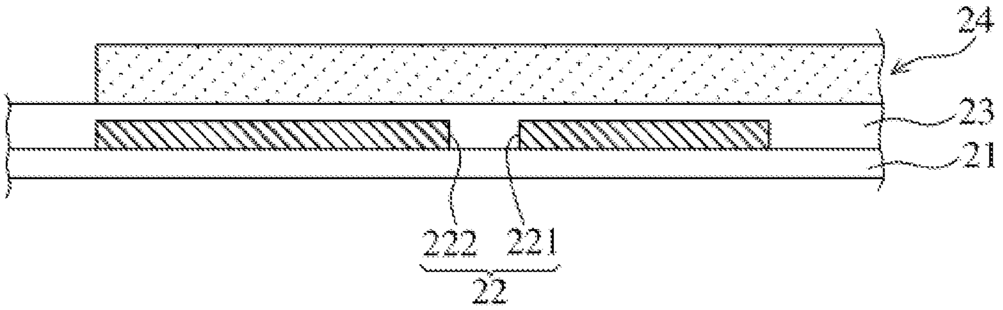
FIG. 5 is a schematic diagram in a polysilicon layer forming step of the manufacturing method of the display panel according to a preferred embodiment of the present disclosure.

Referring to FIGS. 3 and 5, in the polysilicon layer forming step S202, an insulating layer 23 is deposited on the glass substrate 21, and a polysilicon layer 24 is formed on the insulating layer 23.

Figure 6:
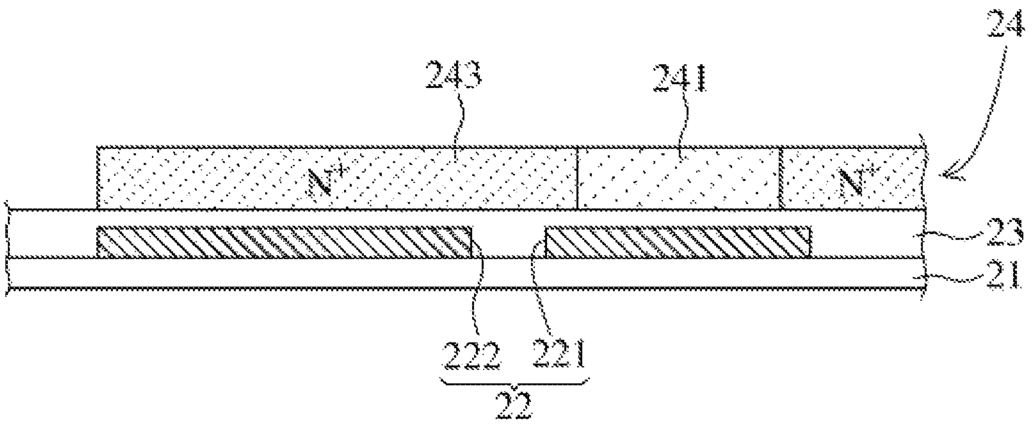
FIG. 6 is a schematic diagram in a N-type doping step of the manufacturing method of the display panel according to a preferred embodiment of the present disclosure.

Referring to FIGS. 3 and 6, in the first doped region doping step S203, the polysilicon layer 24 is defined with a first doped region 243, and the first doped region 243 is processed by N-type doping so that the first doped region 243 is formed with two N-type heavily doped regions and converted to an $N^+$-type layer.

Figure 7:
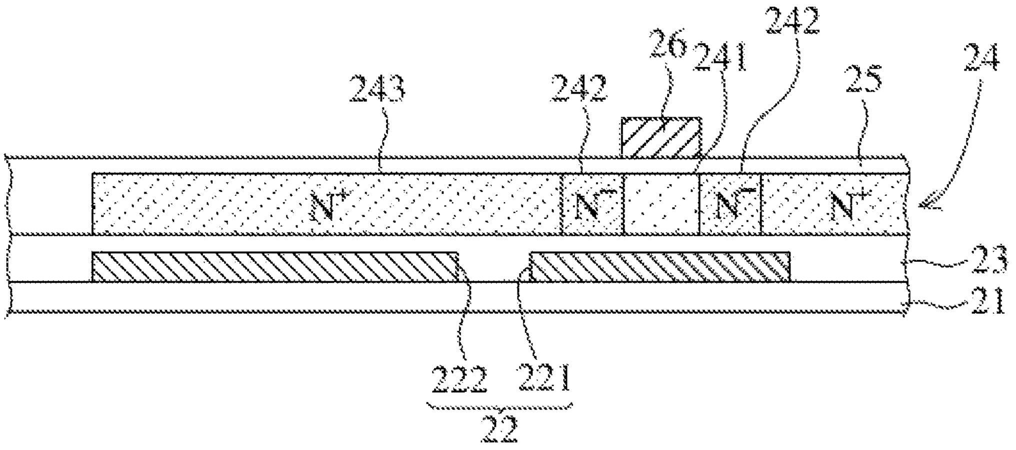
FIG. 7 is a schematic diagram in a gate layer forming step of the manufacturing method of the display panel according to a preferred embodiment of the present disclosure.

Referring to FIGS. 3 and 7, in the second doped region doping step S204, a gate insulating layer 25 and a first metal layer are sequentially deposited, and the first metal layer is patterned as a gate layer 26. The polysilicon layer 24 is defined with a second doped region 242, and the second doped region 242 is processed by N-type doping so that the second doped region 242 is formed with two N-type lightly doped regions and converted to an $N^-$-type layer, wherein the doping type of the first doped region 243 and the doping type of the second doped region 242 are same.

Figure 8:
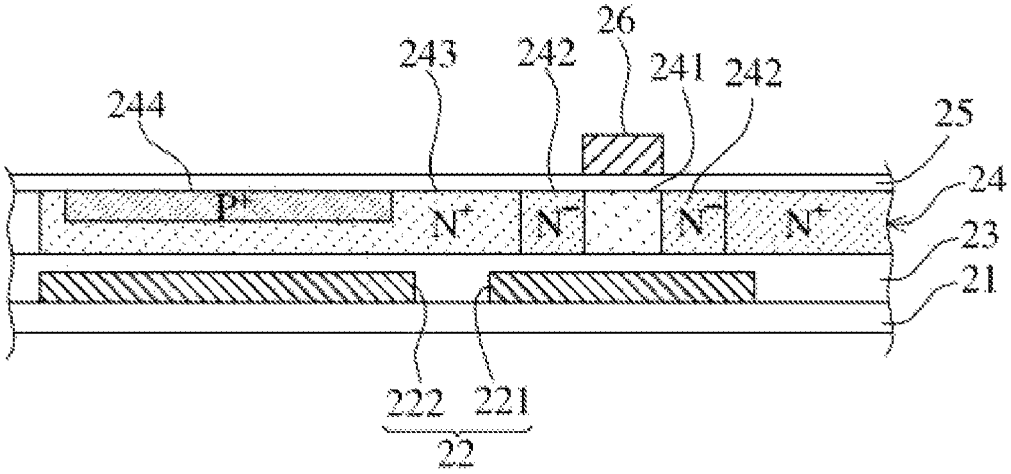
FIG. 8 is a schematic diagram in a P-type doping step of the manufacturing method of the display panel according to a preferred embodiment of the present disclosure.

Referring to FIGS. 3 and 8, in the third doped region doping step S205, a portion of a surface of the first doped region 243 is defined a third doped region 244, and the third doped region 244 is processed by P-type doping so that the third doped region 244 is formed with a P-type doped region and converted to a P-type layer, wherein the doping type of the first doped region 243 and the doping type of the third doped region 244 are different, and the P-type layer is located on the $N^+$-type layer.

Figure 9:
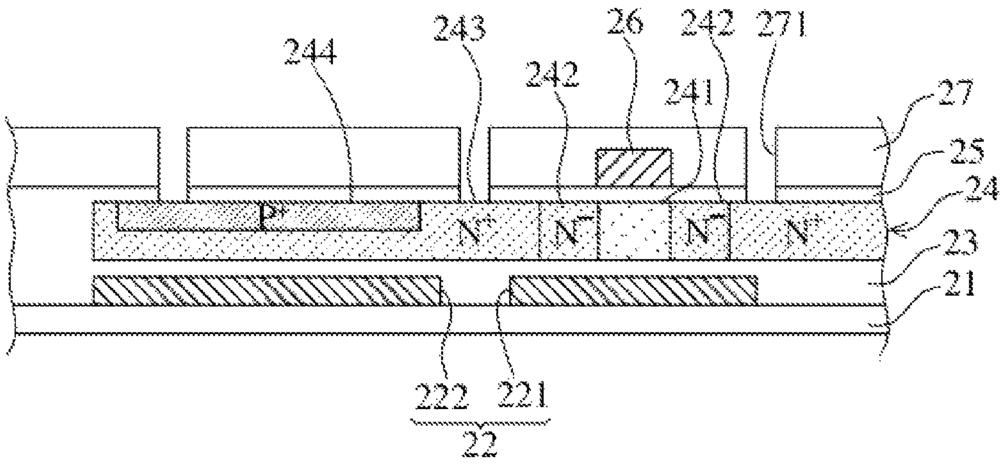
FIG. 9 is a schematic diagram in an interlayer insulating layer forming steps of the manufacturing method of the display panel according to a preferred embodiment of the present disclosure.

Referring to FIGS. 3 and 9, in the interlayer insulating layer forming step S206, an interlayer insulating layer 27 is deposited, and a plurality of holes 271 are formed on the interlayer insulating layer 27.

Referring to FIGS. 2, 3 and 9, in the source-drain contacting layer forming step S207, a second metal layer is deposited in the holes 271, and the second metal layer is patterned as a source-drain contacting layer 28 so that the source-drain contacting layer 28 contacts the $N^+$-type layer of the first doped region 243 and the P-type layer of the third doped region 244. In addition, in the passivation layer forming step S208, a layer of high dielectric constant material is deposited through an atomic layer deposition as a passivation layer 29.

As described above, the thin film transistor is formed on the glass substrate 21 by polysilicon, and the amorphous silicon photodiode is formed by ion implantation technology, so that the intensity of the reflected light of the fingerprint can be recognized by the amorphous silicon photodiode. Since the thin film transistor has a low leakage current, and the current of the amorphous silicon photodiode is identified to obtain a better signal to noise ratio. In addition, the PN structure can realize N-type and P-type doping by ion implantation depth and ion complementary effect. Thus, the thin film transistor and the amorphous silicon photodiode are simultaneously prepared in the process without additional complicated structures and processes.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. A display panel, comprising:
- a substrate; and
- a thin film transistor (TFT) disposed on the substrate and comprising:
  - a polysilicon layer disposed on the substrate and comprising:
    - a first portion;
    - two second portions disposed on two opposite lateral sides of the first portion;
    - two third portions, each disposed on an outer lateral side of a corresponding one of the two second portions away from the first portion; and
    - a fourth portion embedded at a top of one of the two third portions such that a PN structure is defined between the fourth portion and the one of the two third portions to be configured as an amorphous silicon photodiode;
  - a gate layer disposed over the substrate and corresponding to the first portion; and
  - a source-drain contacting layer disposed over the gate layer and electrically contacting the fourth portion and the two third portions.

2. The display panel according to claim 1, wherein the fourth portion is configured to be a portion of the one of the two third portions processed by doping with a material different from another material doped in a remaining portion of the one of the two third portions.

3. The display panel according to claim 1, wherein a projection of the fourth portion projected on the substrate is located within a projection of the one of the two third portions projected on the substrate.

4. The display panel according to claim 1, wherein a projection of the first portion projected on the substrate fully overlaps a projection of a gate of the TFT, that is comprised in the gate layer, projected on the substrate.

5. The display panel according to claim 1, wherein the first portion is a non-doped portion, and the two second portions, the two third portions, and the fourth portion are doped portions; and
- a doping type of the two third portions is same with a doping type of the two second portions, and is different from a doping type of the fourth portion.

6. The display panel according to claim 5, wherein the two second portions are N-type lightly doped portions, the two third portions are N-type heavily portions, and the fourth portion is a P-type doped portion.

7. The display panel according to claim 1, further comprises:
- a light shielding layer, disposed on a side of the substrate facing the polysilicon layer, and comprising:
  - a first light shielding portion,
- wherein the PN structure is located above the first light shielding portion.

8. The display panel according to claim 7, wherein a projection of the fourth portion projected on the substrate overlaps a projection of the first light shielding portion projected on the substrate.

9. The display panel according to claim 7, wherein the light shielding layer further comprises:

a second light shielding portion spaced apart from the first light shielding portion, wherein a projection of the first light shielding portion projected on the substrate overlaps a projection of the fourth portion projected on the substrate, and a projection of the second light shielding portion projected on the substrate overlaps a projection of each of the two second portions projected on the substrate.

10. The display panel according to claim 7, wherein the light shielding layer further comprises:

a second light shielding portion spaced apart from the first light shielding portion, wherein a projection of the second light shielding portion projected on the substrate overlaps a projection of each of the two second portions projected on the substrate.

11. The display panel according to claim 1, further comprises:

an insulating layer, disposed on the substrate, wherein the polysilicon layer is disposed on the insulating layer.

12. The display panel according to claim 7, further comprises:

an insulating layer, disposed on the substrate and covering the light shielding layer, wherein the polysilicon layer is disposed on the insulating layer.

13. The display panel according to claim 1, further comprises:

a gate insulating layer, disposed between the polysilicon layer and the gate layer.

14. The display panel according to claim 13, wherein the gate layer is disposed on a side of the polysilicon layer away from the substrate.

15. The display panel according to claim 14, further comprises:

an interlayer insulating layer, disposed between the gate insulating layer and the source-drain contacting layer, and covering the gate layer.

16. The display panel according to claim 15, wherein the interlayer insulating layer is provided with a plurality of holes, and the source-drain contacting layer contacts each of the two third portions and the fourth portion through a corresponding one of the plurality of holes.

17. The display panel according to claim 15, further comprises:

a passivation layer disposed on the source-drain contacting layer away from the interlayer insulating layer.

18. The display panel according to claim 1, wherein a surface of the fourth portion facing the source-drain contacting layer and a surface of another one of the two third portions facing the source-drain contacting layer are flush.

19. The display panel according to claim 18, wherein the polysilicon layer is integrated.

20. The display panel according to claim 18, wherein the substrate is a glass substrate.

* * * * *